United States Patent [19]
Birx

[11] Patent Number: 5,319,665
[45] Date of Patent: Jun. 7, 1994

[54] HIGH POWER ELECTROMAGNETIC PULSE DRIVER USING AN ELECTROMAGNETIC SHOCK LINE

[75] Inventor: Daniel L. Birx, Oakley, Calif.

[73] Assignee: Science Research Laboratory, Somerville, Mass.

[21] Appl. No.: 972,622

[22] Filed: Nov. 6, 1992

[51] Int. Cl.$^5$ .................. H01S 3/0975; H03K 3/01; H03B 11/00; H04B 3/04
[52] U.S. Cl. .............................. 372/69; 333/20; 331/165; 328/65; 372/81
[58] Field of Search ............... 372/69, 81, 82; 331/165, 166; 315/32; 333/20; 328/65, 166

[56] References Cited

U.S. PATENT DOCUMENTS

2,871,453  1/1959  Bradley ............................ 333/20
5,066,928 11/1991  Ikezi et al. ...................... 333/20

FOREIGN PATENT DOCUMENTS

4296114 10/1992 Japan ............................... 328/65

OTHER PUBLICATIONS

Electromagnetic Shock Waves—I. G. Katayev, London Iliffe Books Ltd., Dorsel House—1966 (no month avail).

Primary Examiner—Rodney B. Bovernick
Assistant Examiner—Robert McNutt
Attorney, Agent, or Firm—Wolf, Greenfield & Sacks

[57] ABSTRACT

A high power electromagnetic pulse driver for generating sub-microsecond rise time pulses having energy contents greater than 1 joule includes an electromagnetic pulse compressor and an electromagnetic shock line for compressing the leading edges of those pulses. The shock line may use non-linear materials whose permeability or permittivity vary greatly with varying field strength. One material whose permeability varies by a useful amount is metglass, an amorphous alloy of silicon and iron. The high power electromagnetic pulse driver may drive gas discharge lasers.

14 Claims, 9 Drawing Sheets

Fig. 4 d = FERRITE OUTER DIAMETER
a = LINE INNER DIAMETER
D = LINE OUTER DIAMETER $\varepsilon_F=14$, $\varepsilon_D=2.7$, $E_F=10^5$ V/cm, and $M_0=200$ gauss

HIGH POWER ELECTROMAGNETIC PULSE DRIVER USING AN ELECTROMAGNETIC SHOCK LINE

FIELD OF THE INVENTION

This invention relates to high power pulse drivers capable of delivering several joules of energy in each pulse.

BACKGROUND OF THE INVENTION

In applications such as driving a discharge laser or a pulsed radar, there is a need for producing short, high energy pulses at a high repetition rate. For example, a driver for a copper vapor laser or a $CO_2$ laser may require pulses of approximately 1 joule or greater, of approximately 10–20 nanoseconds duration and having rise times of 1 nanosecond or less. Such lasers may be utilized in uranium isotope separation and in a broad spectrum of other research, industrial, government and other applications. One high voltage pulsed power source suitable for use in such applications is shown in HIGH VOLTAGE PULSE POWER SOURCE, U.S. patent application ser. no. 07/778,313, filed Oct. 16, 1991 and incorporated herein by reference.

As noted therein, earlier thyratron-based pulse drivers were limited by the performance of the thyratron. One important limitation on thyratron performance is speed. Thyratrons do not have a fast enough rise time to provide multiple-joule pulses having durations in a range of several nanoseconds. Likewise, even the high voltage pulse power source of the U.S. patent application ser. no. 07/778,313 referenced above does not produce pulse rise times in the range of several nanoseconds or shorter.

A pulse rise time may be reduced by passing a pulse through an electromagnetic shock line. A discussion of the general theory of electromagnetic shock lines is provided in *Electromagnetic Shock Waves*, by D. G. Katayev, originally published in the U.S.S.R. by Sovietskaye Radio, Moscow, 1963. An English edition was first published by Iliffe Books, Ltd., London, 1966. The shock lines described therein are capable of operating in the ¼ MW power range on only 2–3 nS output pulses. However, the power-handling capability of these lines, the output pulse rise time, and the power dissipation in these lines is unsatisfactory for current applications.

It is a general aim of the present invention to produce high power pulses in the nanosecond duration range or shorter, having high energy contents.

Another general aim of the present invention is to provide an apparatus capable of reducing the rise time of high power pulses in the nanosecond duration range from several nanoseconds to hundreds of picoseconds, without a significant loss of power.

SUMMARY OF THE INVENTION

In accordance with the above general aims and such other aims and objects as will become apparent to those skilled in the art, there is provided a high power pulse driver which includes a non linear, pulse compressor for generating high energy electromagnetic pulses and an electromagnetic shock line for sharpening a leading edge of each high energy electromagnetic pulse produced by the non linear pulse compressor. Many variations and extensions of this general system should be seen to be within the contemplation of this invention.

For example, the electromagnetic shock line may include a material having either non linear electric properties with respect to electric field strength or non-linear magnetic properties with respect to magnetic field strength. The non linear material may also be a combination of two or more materials having different properties. Such multiple material embodiments may employ coaxial layers of such materials. A high power shock line, including laminations of an amorphous metal alloy and an insulating material, may also be provided.

One non-linear pulse compressor suitable for use in the high power pulse driver of the present invention is that disclosed in the U.S. patent application Ser. No. 07/778,313 referenced above.

Also in accordance with the above general aims, there may be provided a high-energy, pulse output, discharge laser driven by a non-linear pulse compressor feeding an electromagnetic shock line. The shock line may use laminations of an amorphous metal and an insulating material disposed between two coaxial conductors.

The present invention may be better understood by reading the following description in connection with the drawing, wherein like reference designations indicate like elements.

BRIEF DESCRIPTION OF THE DRAWINGS

For a better understanding of the present invention, together with other and further objects, advantages and capabilities thereof, reference is made to the accompanying drawings, which are incorporated herein by reference and in which.

DETAILED DESCRIPTION OF THE INVENTION

Some embodiments of the present invention are now described with reference to the figures.

Figure 1:
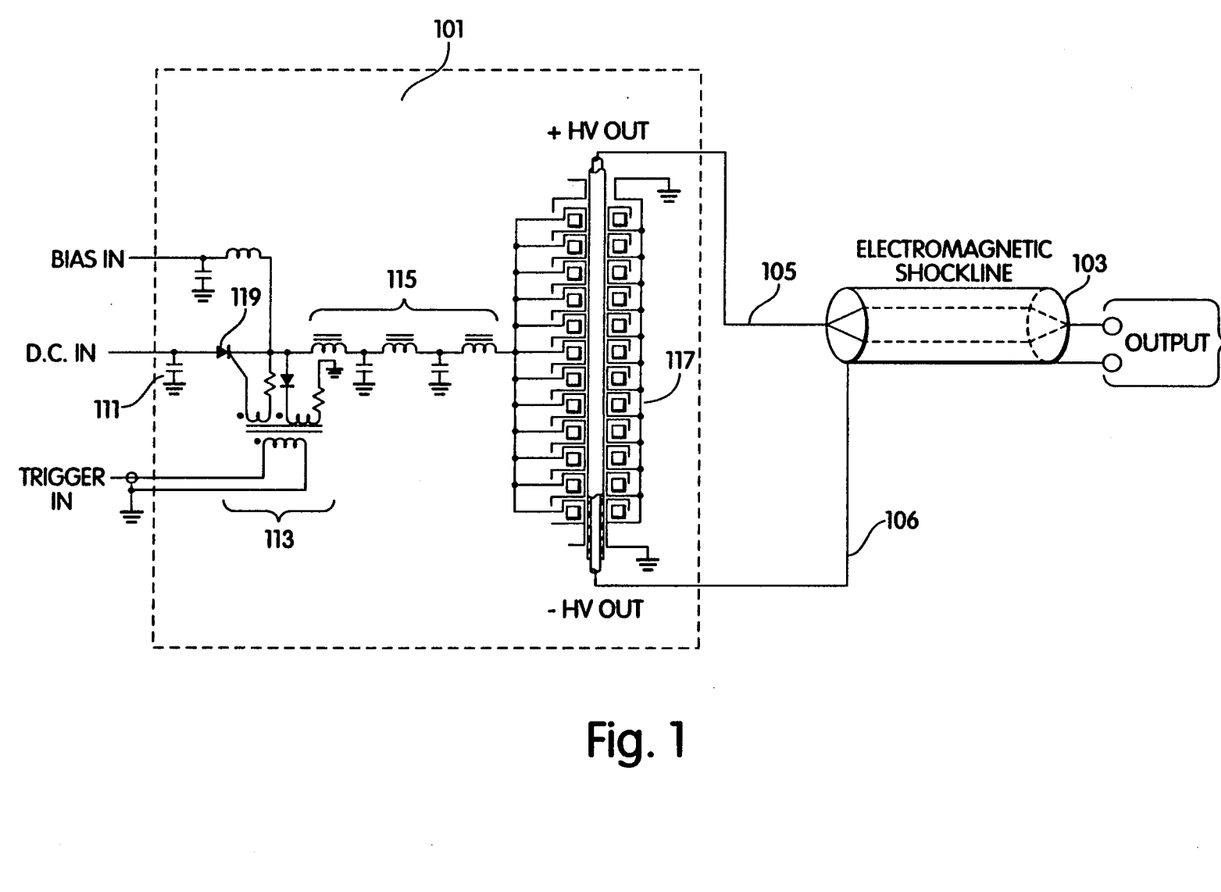
FIG. 1 is a semi-schematic system diagram of an electromagnetic pulse driver using an electromagnetic shock line in connection with a non linear pulse compressor.

A semi-schematic system diagram of a basic system is shown in FIG. 1. This basic system includes an electromagnetic pulse generator 101 and an electromagnetic shock line 103. Electromagnetic pulse generator 101 is a non-linear pulse compressor which produces high energy electromagnetic pulses across conductors 105 and 106. The rise time of the leading edge of each pulse entering electromagnetic shock line 103 is greatly reduced as the pulse passes through the shock line to output terminals 107. One embodiment of the present invention can produce up to 1 GW of power in 1 nS pulses having rise times of 200 pS. As noted above, the shock lines of the prior art were capable of operating in the ½ MW power range on only 2-3 nS output pulses.

The non linear pulse compressor 101 shown in FIG. 1 is disclosed in greater detail in U.S. patent application Ser. No. 07/778,313, noted above. In brief, the non-linear pulse compressor includes a storage capacitor 111, a discharge circuit 113, compressor stages 115, and an induction transformer 117, storage capacitor 111, discharge circuit 113 and compressor stages 115 all operating at voltages in the vicinity of 1 kV or less. Storage capacitor 111 is charged by application of a charging current to the terminal D.C. IN. When an output pulse is desired, a trigger pulse is applied to discharge circuit 113 at terminal TRIGGER IN. Discharge circuit 113 includes SCR 119, which discharges storage capacitor 111 into compressor stages 115. The pulse is further compressed in each successive compressor stage 115, producing an output pulse which may, for example have a duration of about 1 nS and a peak voltage of about 1 kV. Induction transformer 117 then steps up the voltage of the compressed pulse to about 10-12 kV.

The non-linear pulse compressor performance may be tailored for a particular application by choice of components. In the instant application as a laser driver, the compressor 101 may be designed to produce a 1 GW pulse having a rise time of about 1-10 nS. Such a pulse may have a rise time less than about 1 nS after passing through electromagnetic shock line 103. However, the improvement in rise time of the pulse is made by electromagnetic shock line 103 without a significant loss in the input energy. Only a very small portion of the leading edge of the pulse is lost as the leading edge is sharpened by a slight erosion of the very earliest part.

Embodiments of electromagnetic shock line 103 will now be discussed in further detail with reference to FIGS. 2, 3a, 3b and 3c.

Figure 2:
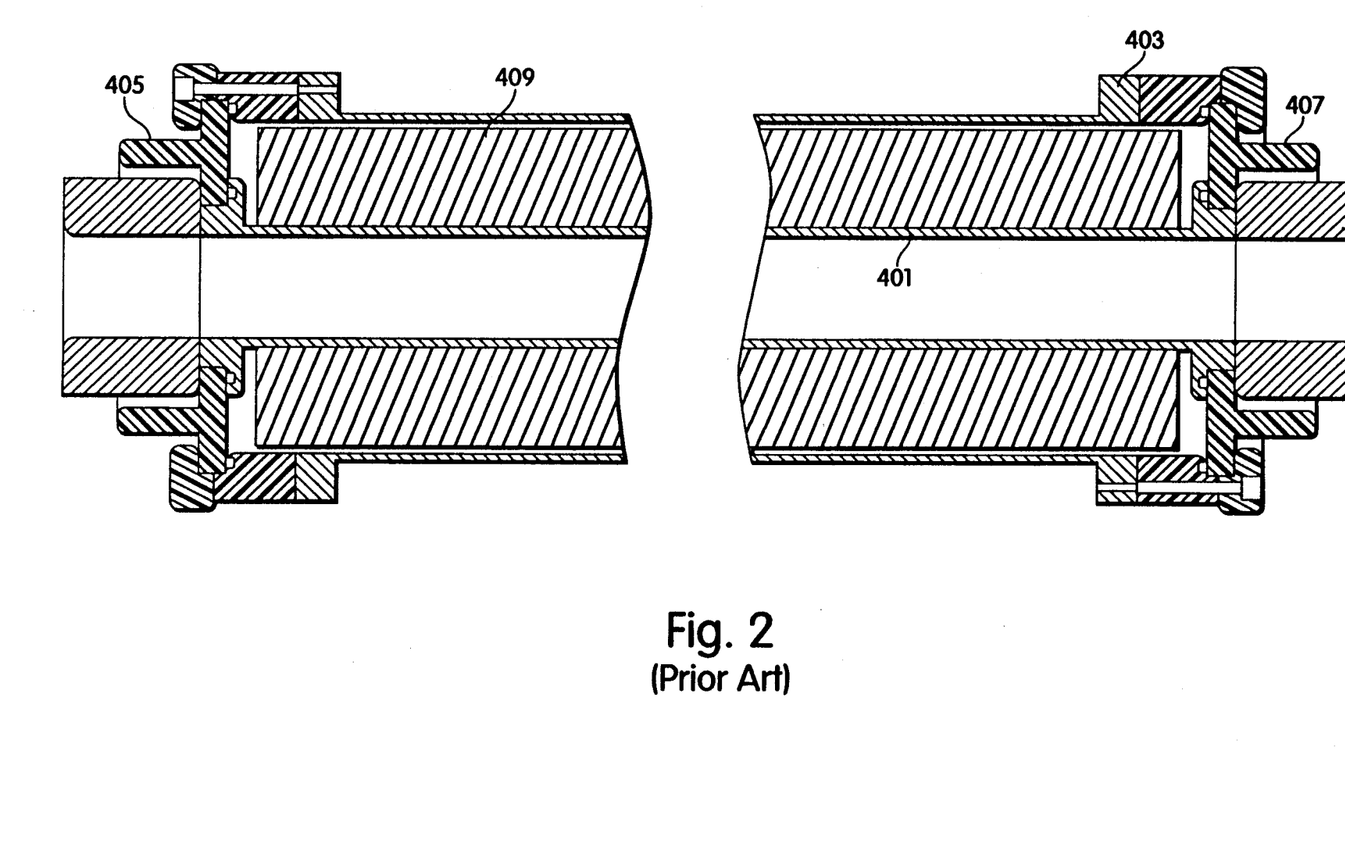
FIG. 2 is a cross sectional view, taken through a diameter of a cylindrical electromagnetic shock line.

FIG. 2 shows an electromagnetic shock line of the prior art having a cylindrical inner conductor 401 and a cylindrical outer conductor 403 coaxially disposed about a center line $C_L$. Inner conductor 401 and outer conductor 403 are held in a fixed relationship to each other by high voltage insulating rings 405 and 407. A portion of the space between inner conductor 401 and outer conductor 403 is filled with a non-linear material 409, some of whose properties will now be discussed in greater detail.

In general, non linear material 409 should exhibit either a significant variation in permeability when a magnetic field of varying strength is applied thereto, or a significant variation in permittivity when an electric field of varying strength is applied thereto. Additionally, a desirable property of non-linear material 409 is that it should exhibit a low electrical loss when excited by signals having frequencies ranging from D.C. through the Giga-Hertz range.

To provide a useful degree of pulse compression, the permeability or permittivity should vary by a factor of 100:1 or greater, when field strength varies from near zero to saturation of non-linear material 409. The variation ratio should be measured in response to a pulse having a rise time and duration similar to that of the expected input pulse, because the ratio varies with the pulse characteristics. Preferable materials have ratios of 1,000:1 or greater. Ferro-electric materials with very low conductivity and a permittivity having useful variation include strontium titanate and barium titanate. Ferro-magnetic materials typically have a greater ratio of variation in permeability than the variation in permittivity exhibited by ferro electric materials. The length of the shock line needed to shorten a pulse rise time by a fixed amount decreases as the ratio of variation increases. Thus, in applications requiring very short pulses, ferro magnetic materials may allow shorter electromagnetic shock lines to be constructed. Such materials may include conventional ferrites, amorphous alloys of iron and silicon, such as metglass, and nickel-iron tapes.

Most well-known ferrites do not exhibit a sufficient variation in permeability over varying field strength. However, amorphous metal tapes may have a variation in permeability up to about six times greater than ferrites. Amorphous alloys of iron and silicon exhibit variations in permeability of 1,000:1 or greater. For example, metglass exhibits a variation in permeability of 1,000:1, having a maximum permeability of about 1,000. At saturation, permeability goes to 1.

However, this embodiment may be of limited applicability to very large electromagnetic pulses, because pulses of the magnitude of interest may exceed the electric field breakdown strength of materials usable for the non-linear material 409.

Figure 3A:
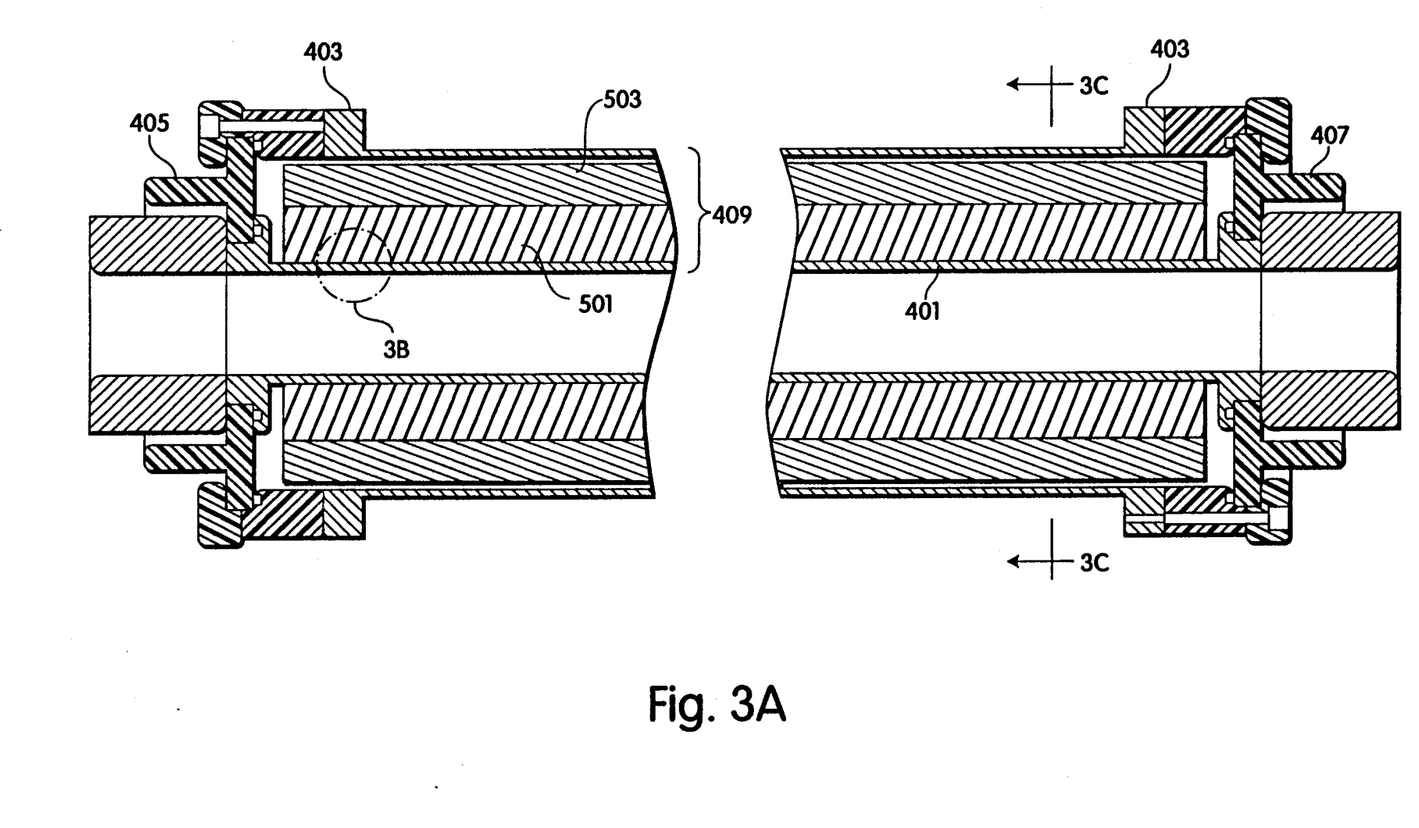
FIG. 3a is a cross-sectional view, taken through a diameter of a cylindrical electromagnetic shock line having multiple, coaxial media.

As shown in FIG. 3a, an improved electromagnetic shock line may be constructed using a layer of non-linear material 501 whose permeability varies with field strength and another layer of material 503 having a high dielectric strength. An advantage of such a structure is that material 503 helps reduce the electric field appearing across layer 501.

The improved structure therefore permits larger electromagnetic pulses to be input into the shock line without exceeding the electric field breakdown strength of material 501. This allows the use of a pulse having a larger magnetic field, which in turn is known to produce a faster rise time pulse out of the electromagnetic shock line.

However, this improved embodiment still exhibits excess power dissipation, because ferro-magnetic non-linear materials, including the alloys of iron and silicon, often have substantial conductivities. Currents set up in the non-linear material cause large losses when used in electromagnetic shock lines. For example, the conductivity of metglass is about 7.7 kMhos/cm.

One way to take advantage of the large variations in permeability of the alloys of iron and silicon or other materials, while not sustaining large power losses is to construct non-linear material 409, in accordance with the principles of the present invention, as alternating laminations of ferro-magnetic material and insulating material.

Figure 3B:
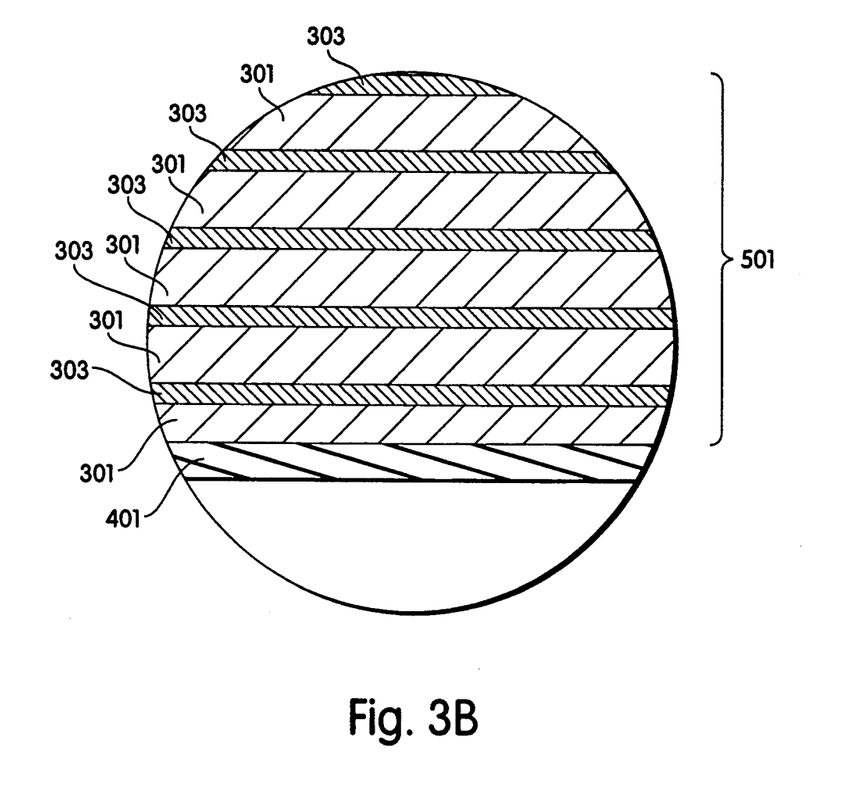
FIG. 3b is an enlarged cross sectional view of the circled portion 3b of FIG. 3a as it would appear for a preferred embodiment of the invention.
Figure 3C:
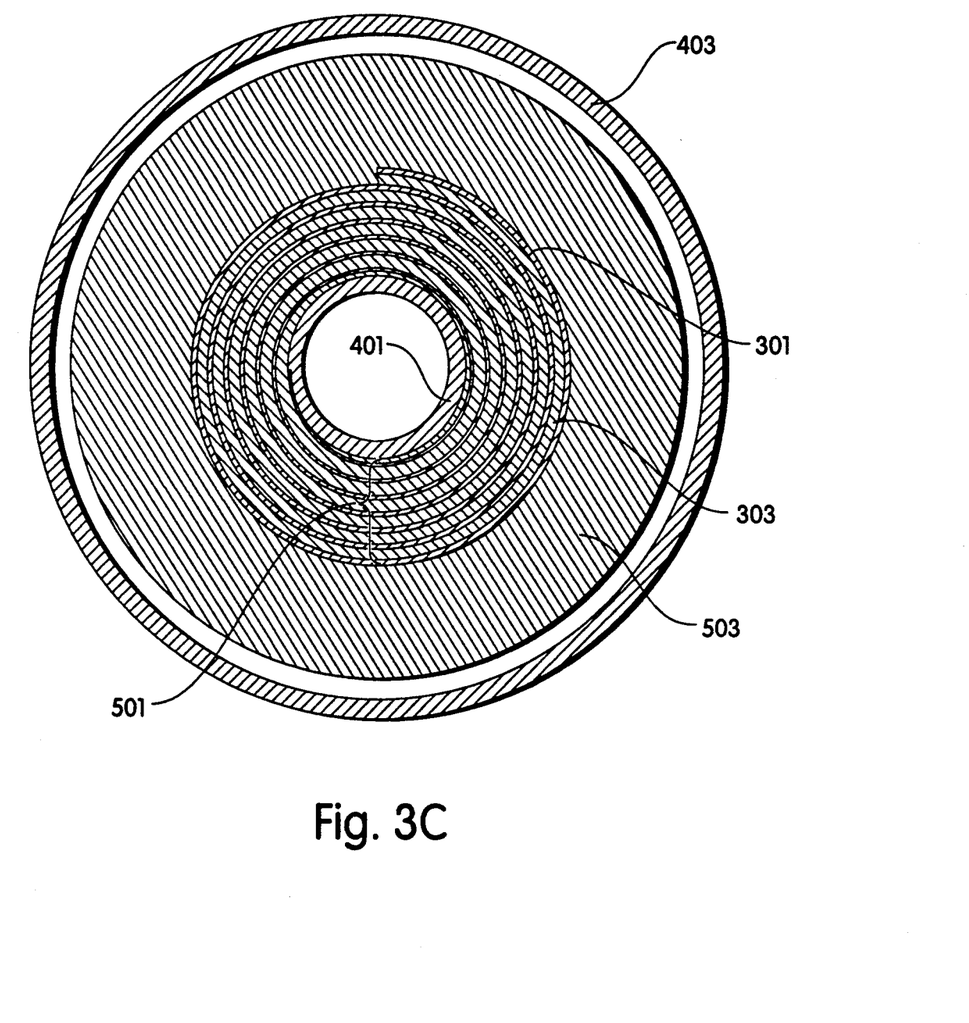
FIG. 3c is a cross-sectional view, taken at line c—c in FIG. 3a of a cylindrical electromagnetic shock line having multiple, coaxial media.

In a further improvement, shown in FIG. 3b, an electromagnetic shock line may be built in accordance with the principles of the present invention, by forming the non-linear layer 501 as a laminate of an amorphous metal having the requisite permeability (as previously indicated), for example metglass, and insulation. Metglass is available in ribbon form. A shock line may therefore be constructed by forming alternating layers of metglass (or other amorphous metal) 301 and an insulating material 303 about inner conductor 401 to form non-linear material 501 as shown. The alternating layers could be formed by coating a ribbon of metglass with an insulating material and forming a spiral winding of the combination about inner conductor 401, as shown in FIG. 3c. The laminated structure of either FIG. 3b or FIG. 3c disrupts much of the induced current flow in layer 501. Therefore, the resulting structure exhibits small energy losses, on the order of 10% of the input energy.

It should be noted at this point that the laminated structures in FIGS. 3b and 3c could be used in the basic shock line structure of FIG. 2. Such an embodiment would exhibit reduced power dissipation in comparison with a solid non-linear material 409. However, this embodiment does not have the additional benefit of greater pulse magnitude capacity as seen in the embodiment of FIG. 3a.

One approach to the design of an electromagnetic shock line is now discussed in connection with FIGS. 4–6.

This design exercise will assume a structure essentially as shown in FIG. 2. The design techniques and physical principles employed in this exercise are adapted from the work of Katayev, and may be readily extended and adapted to other electromagnetic shock line designs, including other designs disclosed herein. The principles of performing such an adaptation are mentioned below.

The choice of materials for layer 501 and material 503 establishes values for certain intrinsic material properties which will be used in the design process. These include: the saturation magnetization of the ferrite layer 501, $M_O$; one half the electric field breakdown strength of the ferrite layer 501, $E_F$; the permittivity of the dielectric comprising material 503, $\epsilon_D$; and the permittivity of the ferrite layer 501, $\epsilon_F$. The design parameters to be calculated are: the inner diameter of the ferrite layer 501, a; the outer diameter of the ferrite layer 501, d; the inner diameter of outer conductor 403, D; and the length of the electromagnetic shock line, L.

In the structure of FIG. 3a, this example design exercise assumes a nickel zinc ferrite is used as the material of layer 501. Material 503 will be assumed in this example design exercise to be a dielectric whose permittivity varies only negligibly with field strength. These are simplifying assumptions made to make the design problem tractable; however, other simplifying assumptions may be made or the characteristics of other suitable materials may be used. For example, $M_O$, $E_F$ and $\epsilon_F$ for a laminated metglass and dielectric layer 501 could easily be substituted for the values of the nickel-zinc ferrite. The values substituted should be measured, bulk values of the laminated structure to be used.

There are a variety of criteria which may serve as the starting point for an electromagnetic shock line design. In the present exercise, matching the input impedance of the shock line to the output impedance of an electromagnetic pulse generator is selected as the starting point. Matching impedances will ensure maximum power transfer from the pulse generator to the electromagnetic shock line. The impedance of the shock line in the absence of large fields is given by:

$$\rho = \frac{60}{\epsilon_{\textit{eff}}^{\frac{1}{2}} \cdot \mu^{\frac{1}{2}}} \cdot \ln \frac{D}{a},$$

while the impedance at the leading edge of a shock wave in a shock line is given by:

$$\rho_{sh} = \frac{60 \, T_F}{\epsilon_F^{\frac{1}{2}} \, \sigma} \left( 1 + \frac{8\pi M_0}{H_F} \sigma \right)^{\frac{1}{2}} \cdot \left[ \left( 1 - \frac{\epsilon_F}{\epsilon_D} \right) \sigma + \frac{\epsilon_F}{\epsilon_D} \right]^{\frac{1}{2}}.$$

Finally, the impedance of a saturate shock line, wherein μ approaches unity, is given by:

$$\rho_o = \frac{60}{\epsilon_{\textit{eff}}^{\frac{1}{2}}} \cdot \ln \frac{D}{a},$$

In these equations, $$\epsilon_{\textit{eff}} = \frac{\epsilon_F \epsilon_D \ln \frac{D}{a}}{\epsilon_D \ln \frac{D}{a} + \epsilon_F \ln \frac{D}{d}},$$

$$T_F = \ln \frac{d}{a}, \; T_D = \ln \frac{D}{d}, \; \text{and} \; \sigma = \frac{T_F}{T_F + T_D}.$$

Design values for $\rho_o$ and $\sigma$ may be selected by making reference to graphs of $\rho_o$ and $\sigma_{sh}$ as functions of $\sigma$. The case for a nickel-zinc ferrite, and d/a=4/3 is shown in FIG. 4.

Figure 4:
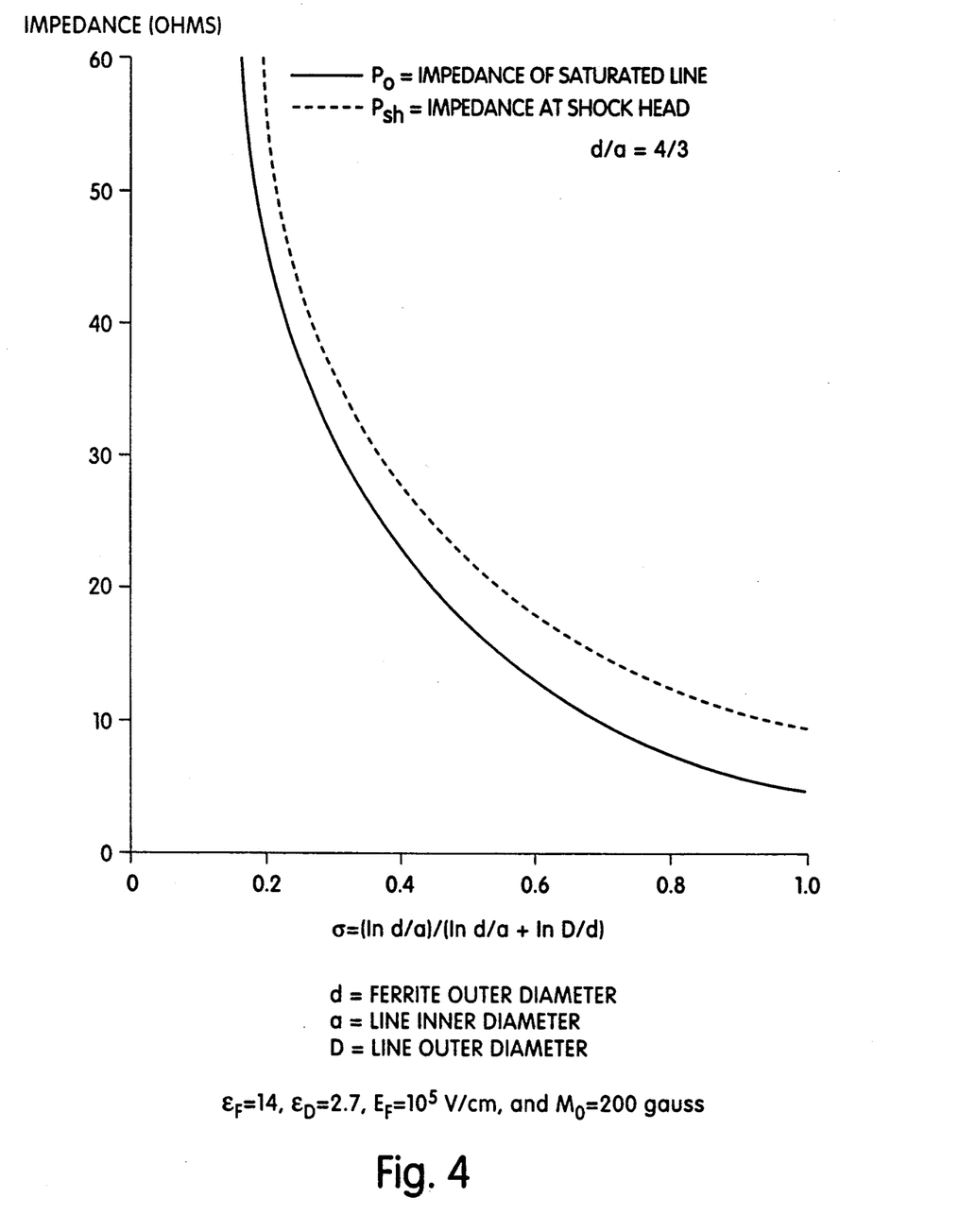
FIG. 4 is a graph of shock line impedance l as a function of $\sigma$ for one family of electromagnetic shock line designs.
Figure 5:
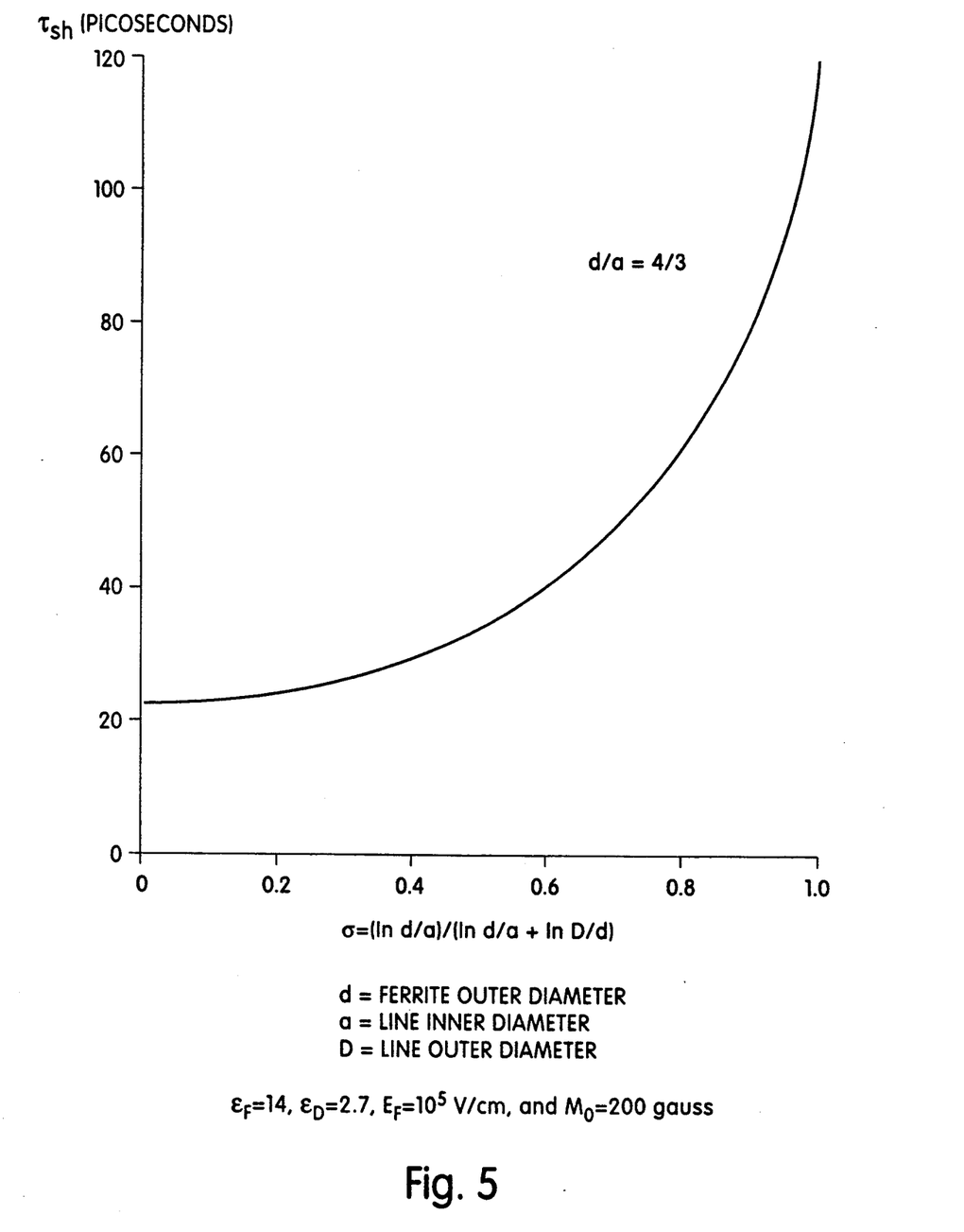
FIG. 5 is a graph of $\tau_{SH}$ as a function of $\sigma$ for one family of electromagnetic shock line designs.

Using the desired impedance $\rho_o$ or $\rho_{sh}$, a value for $\sigma$ is read off of the graphs in FIG. 4. The value of $\sigma$ is used to find the rise time of the output waveform, $\tau_{sh}$, using the graph in FIG. 5. If the value of $\tau_{sh}$ is unacceptable, the selection of impedance may be changed, or the initial assumptions may be changed, as the design process is iterative.

Figure 6:
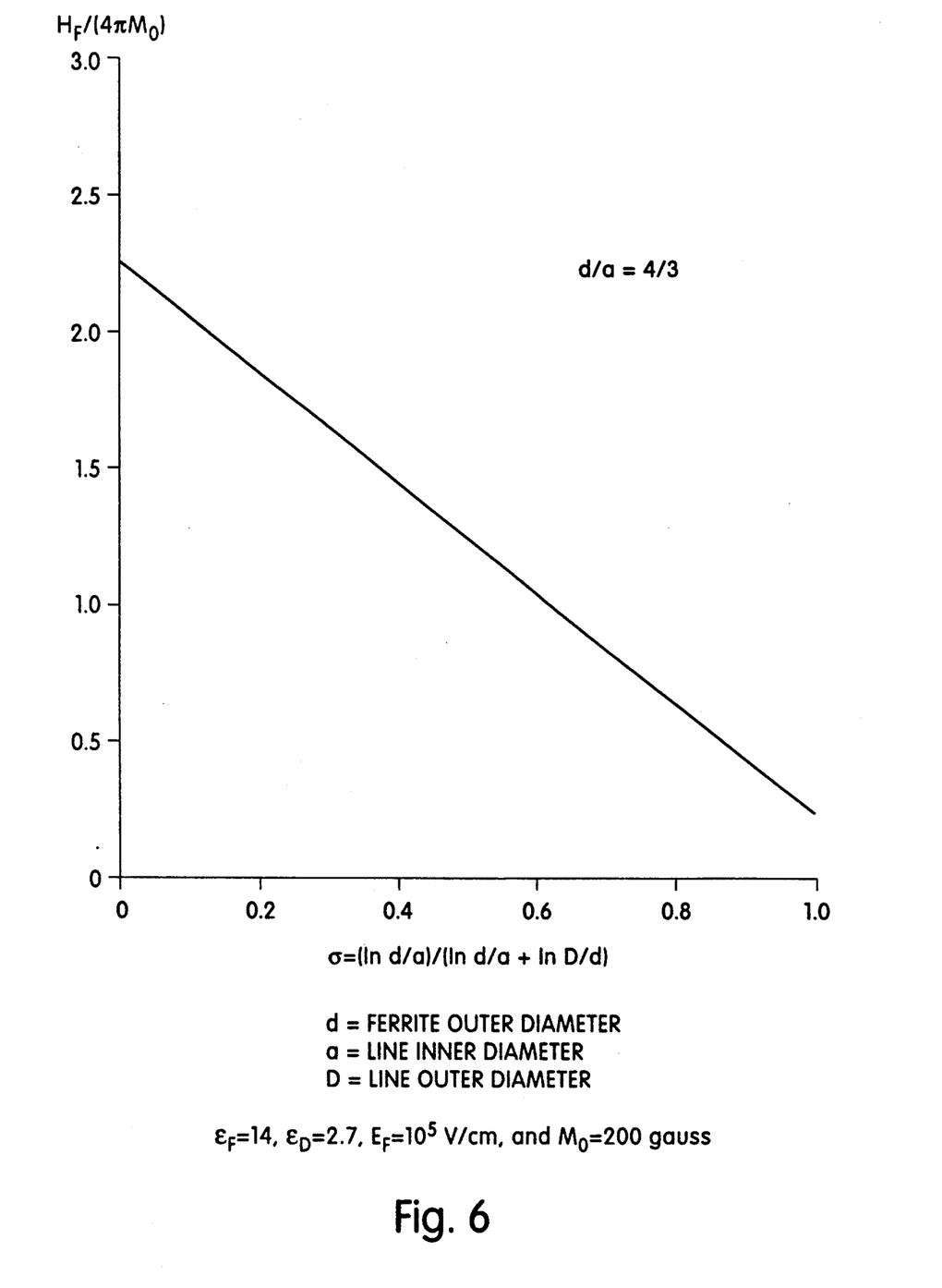
FIG. 6 is a graph of $H_f/(4\pi M_O)$ as a function of $\sigma$ for one family of electromagnetic shock line designs.

Likewise, the graph in FIG. 6 may be used to find $H_F$ using $\sigma$. The shock wave current $I_{sh}$ required to be produced by the pulse generator may be determined from the relationship $H_F = 0.4 I_{sh}/a$. Since d/a=4/3, d is now known. Outer diameter, D, may then be found from the expression for $\sigma$, above.

Finally, the length, L, of the line is calculated on the basis of the input waveform rise time, $\tau_{in}$, the characteristic inductance of the line, $L_o$, and the characteristic capacitance of the line, $C_o$. Thus:

$$L = \frac{\tau_{in} v_o}{\mu_{sh}^{\frac{1}{2}} - 1}, \text{ where}$$

$$v_o = \frac{1}{(L_o C_o)^{\frac{1}{2}}}, \text{ and } \mu_{sh} = \frac{\rho_{sh}}{\rho_o}.$$

An electromagnetic pulse compressor 101 driving a shock line 103 such as that described in connection with FIG. 3b produces short high power pulses. Pulses produced by this embodiment may have an energy content of up to 20 joules. Other choices for the pulse compressor 101 design and shock line 103 design could produce even larger energy contents.

Figure 7:
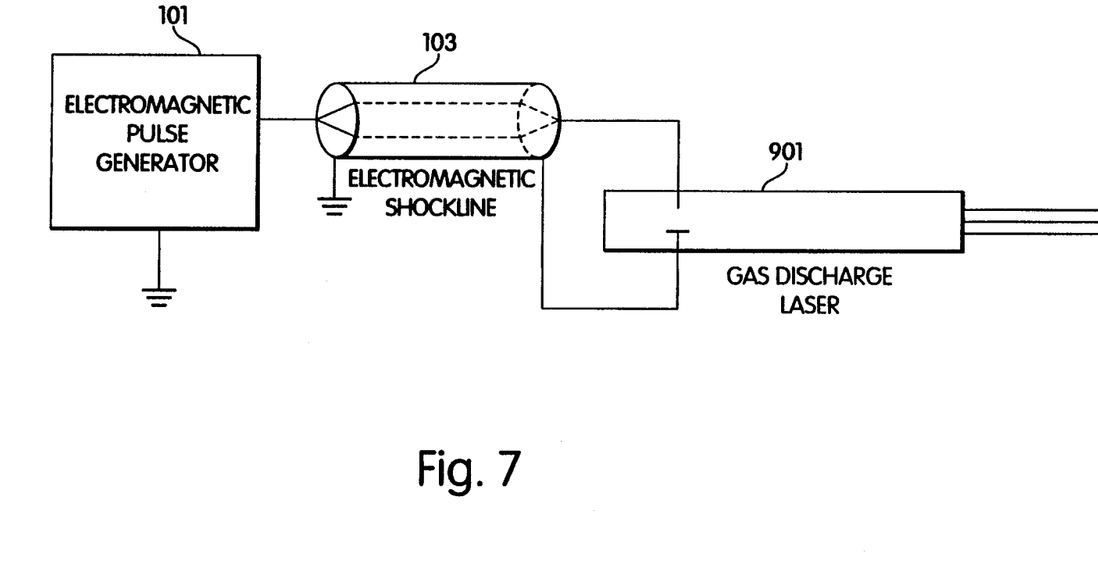
FIG. 7 is a schematic representation of a gas discharge laser driven by an electromagnetic pulse generator in combination with an electromagnetic shock line.

As shown in FIG. 7, an electromagnetic pulse generator 101 in combination with an electromagnetic shock line 103 may be used to drive a gas discharge laser 901. Laser 901 may be one of the copper vapor or $CO_2$ types, for example. Using a pulse compressor 101 in combination with a wound, metglass shock line 103, laser 901 may be pumped with 1 nS, 20 J pulses having rise times on the order of 200 pS. One suitable embodiment of the shock line has an inner conductor 401 with an OD of ¼ inch, an outer conductor 403 with an ID of 1 inch, and a length of 79 inches.

Although the present invention has been described in connection with a number of specific embodiments, numerous extensions, modifications and other applications should now be evident to those skilled in the art. The embodiments presented herein are illustrative, and not to be considered limiting, having been presented by way of example only. The scope of the present invention is limited only by the appended claims and equivalents thereto.

What is claimed is:

1. A high-power pulse driver, comprising:
   means for producing high energy electric pulses, including an electromagnetic pulse compressor; and
   an electromagnetic shock line for sharpening a leading edge of each high energy electric pulse produced by the means for producing, the electromagnetic shock line including
   a centrally disposed conductor;
   a peripherally disposed conductor; and
   a body of non-linear material disposed between the centrally disposed conductor and the peripherally disposed conductor, wherein the body of material has a permeability, $\mu$, which varies by a ratio of at least 100:1, as magnetic field strength varies from near zero to a maximum in a period shorter than about 100 nS.

2. A high power pulse driver as claimed in claim 1, wherein the body of non-linear material includes:
   a plurality of layers of the non-linear material; and
   an insulating material disposed between each adjacent pair of said plurality of layers of non-linear material, thereby separating the layers one from another.

3. A high power pulse driver as claimed in claim 2, wherein the plurality of layers comprises:
   a spirally wound ribbon of non-linear material, each turn of the spirally wound ribbon forming one of said plurality of layers.

4. A high power pulse driver as claimed in claim 3, wherein the non linear material is metglass.

5. A high power pulse driver as claimed in claim 4, further comprising:
   a layer of material having a high dielectric strength relative to the body of non linear material, disposed between the body of non-linear material and one said conductor.

6. A discharge laser system, comprising:
   a high power pulse driver according to claim 1; and
   a discharge laser for receiving from the electromagnetic shock line high energy electric pulses with sharpened leading edges.

7. A discharge laser system as claimed in claim 6, wherein the body of non-linear material includes:
   a plurality of layers of the non-linear material; and
   an insulating material disposed between each adjacent pair of said plurality of layers of non-linear material, thereby separating the layers one from another.

8. A discharge laser system as claimed in claim 7, wherein the plurality of layers comprises:
   a spirally wound ribbon of non linear material, each turn of the spirally wound ribbon forming one of said plurality of layers.

9. A discharge laser system as claimed in claim 8, wherein the non-linear material is metglass.

10. A discharge laser system as claimed in claim 9, further comprising:
    a layer of material having a high dielectric strength relative to the body of non-linear material, disposed between the body of non-linear material and one said conductor.

11. A high power shock line, comprising:
    a centrally disposed conductor;
    a peripherally disposed conductor;
    a plurality of layers of an amorphous metal having a permeability which varies by a ratio of at least 100:1, as magnetic field strength varies from near zero to a maximum in a period shorter than about 100 nS; and
    an insulating material disposed between each adjacent pair of said plurality of layers of non-linear material, thereby separating the layers one from another.

12. A high power shock line as claimed in claim 11, wherein the plurality of layers further comprises:
    a spirally wound ribbon of the amorphous metal, each turn of the spirally wound ribbon forming one of said plurality of layers.

13. A high power shock line as claimed in claim 12, wherein the amorphous metal is metglass.

14. A high power shock line as claimed in claim 13, further comprising:
    a layer of material having a high dielectric strength relative to the body of non-linear material, disposed between the body of non linear material and one said conductor.

* * * * *